(12) United States Patent
Lau

(10) Patent No.: US 6,492,620 B1
(45) Date of Patent: Dec. 10, 2002

(54) EQUIPOTENTIAL FAULT TOLERANT INTEGRATED CIRCUIT HEATER

(75) Inventor: James C. Lau, Torrance, CA (US)

(73) Assignee: TRW Inc., Redondo Beach, CA (US)

( * ) Notice: Subject to any disclaimer, the term of this patent is extended or adjusted under 35 U.S.C. 154(b) by 25 days.

(21) Appl. No.: 09/860,872

(22) Filed: May 18, 2001

(51) Int. Cl.$^7$ ................................................. H05B 3/00
(52) U.S. Cl. ........................ 219/209; 361/782; 347/210
(58) Field of Search ................................ 219/209, 470; 156/184; 228/180.22; 257/754; 324/754; 347/210; 361/782, 270

(56) References Cited

U.S. PATENT DOCUMENTS

| | | | | |
|---|---|---|---|---|
| 4,506,272 A | * | 3/1985 | Arai | 347/210 |
| 5,164,037 A | * | 11/1992 | Iwami et al. | 156/184 |
| 5,541,524 A | * | 7/1996 | Tuckerman et al. | 324/754 |
| 5,629,838 A | * | 5/1997 | Knight et al. | 361/782 |
| 5,654,588 A | * | 8/1997 | Dasse et al. | 257/754 |
| 6,347,735 B1 | * | 2/2002 | Frantz et al. | 228/180.22 |
| 6,376,270 B1 | * | 4/2002 | Gu et al. | 438/30 |
| 6,396,706 B1 | * | 5/2002 | Wohlfarth | 361/270 |
| 6,423,939 B1 | * | 7/2002 | Pan | 219/209 |

* cited by examiner

Primary Examiner—Teresa Walberg
Assistant Examiner—Leonid M Fastovsky
(74) Attorney, Agent, or Firm—Ronald M. Goldman

(57) ABSTRACT

Fault tolerance is incorporated within the integral electric heaters of a reworkable electronic semiconductor component, such as a reworkable multi-chip module, to increase production yield and longevity of the rework feature. Components of the foregoing kind contain a multi-layer substrate to bond to a printed wiring board, and, for rework, the component includes a plurality of electric heaters arranged side by side on a bottom layer of the substrate. When energized with current, the heaters generate sufficient heat to weaken the adhesive or solder bond to the printed wiring board without delaminating the layers of the substrate, allowing the electronic semiconductor component to be pulled away from the printed wiring board for rework. Additional circuitry is included to automatically route heater current around, that is bypass, any current-interrupting break (s) as may form in any of the electric heaters giving the heaters a fault tolerance.

16 Claims, 5 Drawing Sheets

EQUIPOTENTIAL FAULT TOLERANT INTEGRATED CIRCUIT HEATER

FIELD OF THE INVENTION

This invention relates to reworkable electronic semiconductor components, including multi-chip modules ("MCMs"), that incorporate electrical heaters integrally within the component structure to produce the heat necessary to soften or weaken the bond of the component to the printed wiring board to which the component is attach, allowing removal of the component from a printed wiring board for rework. More particularly, the invention relates to a new heater structure for the electronic semiconductor component that is fault tolerant to current-interrupting breaks as may be formed or produced in any of the heaters. The invention is applicable to substrate-to-printed wiring board attachments that employ adhesive bonds, such as found in the thermoset adhesive lead type components, or that employ reflow solder bonds, such as found in ball grid array lead-less type components.

BACKGROUND

The present invention improves upon the invention of Berkely et al presented in U.S. Pat. No. 6,031,729, granted Feb. 29, 2000 entitled "Integral Heater for Reworking MCMS and Other Semiconductor Components" (hereafter the "Berkely et al '729 patent") assigned to TRW Inc., the assignee of the present invention. In a broader aspect, the invention improves upon electrical heater systems as may be applied in other ways than presented in the foregoing patent by incorporating circuits that provide fault tolerance to current-interrupting breaks in the electric heaters of an electric heater system for an electronic component that avoids disruption of heating.

A principal application of the present invention is with reworkable Multi-Chip Modules, such as described in the cited Berkley et al '729 patent. Multi-Chip Modules ("MCMs") perform a variety of electronic functions, and are finding increasing use in sophisticated electronic applications, particularly airborne and space-borne application. By definition, an MCM contains two or more semiconductor die or chips, as variously termed, and ancillary electrical components, assembled in a single enclosed package, that together comprise an electronic circuit function. The semiconductor chips contain the micro-miniature integrated circuits, such as processors, amplifiers, memory, and the like.

In one type of MCM structure, the semiconductor chips and components are supported on a common base, consisting of an integral multi-layer printed wiring structure, referred to as the substrate. Often that substrate is formed of ceramic, an electrical insulator that is rigid, allows for plated-on conductors of the finest widths and spacing with the greatest accuracy and is able to maintain a hermetic seal. Metallic conductors printed on various layers of the substrate, and metallic vias through the layers, serve to electrically connect the semiconductor chips to each other and to the external interfaces of the MCMs.

The foregoing elements are contained together in a single enclosed four-sided package, often hermetically sealed, that serves as a protective housing for the semiconductor chips and associated components. The ceramic substrate, being hermetic, serves as the bottom wall to the module. A metal wall, or seal ring, is brazed to the substrate around the perimeter, encompassing the components and a lid welded to the top surface of this seal ring hermetically seals the components inside. A number of electrical contacts or leads extend out the four sides of the MCM to provide external electrical input-output connections to the MCM.

In practice MCMs are generally installed upon a printed wiring board, much larger in area than an MCM, that contains the electrical interconnections between the MCMs and other components thereon. The larger wiring board is typically constructed of a material such as glass-epoxy or glass-polyimide, a less expensive and lower quality material than the ceramic of the substrate. For airborne and space applications, MCMs are typically bonded to the printed wiring boards. Bonding enhances thermal conductivity to the MCM, and isolates mechanical loads from the input-output connections of the MCM, which promotes longer product life. A variety of adhesives, such as thermosetting epoxies or thermoplastics, and solder are available to provide the bonding.

To bond the MCM in place, as example, a layer of thermally sensitive adhesive is applied to either the underside surface of the MCM, or directly to the surface of the printed wiring board at the location to which that component is to be placed. With the MCMs and all other components for that circuit board properly positioned, the board is then placed in an oven and the temperature raised to cure or reflow the adhesive, attaching the MCMs and other components in place. When removed from the oven and cooled down to room temperature the MCMs are firmly attached to the printed wiring board.

Solder is another known thermally sensitive adhesive material used to fasten parts together. A second known technique for fastening the MCM to the circuit board is the solder ball grid array. Instead of incorporating electrical leads extending from the side of the MCM package and using a separate adhesive for fastening the MCM to the circuit board, as in the foregoing structure, the electrical leads are instead formed by electrical vias extending through the multiple layers of substrate to the underside surface of the MCM package. At the underside the terminal end of those vias typically appear by design arranged in regular rows and columns. Minute solder balls or solder columns, different geometry's for the dab of solder collectively referred to herein as solder balls, are formed at the terminal ends of those vias on the underside of the substrate.

In assembly, the MCM package is placed upon the printed wiring board, the latter of which contains solder pads that mate with the solder balls on the MCM package and the temperature is raised above the solder eutectic at which the solder reflows. When cooled, the solder solidifies and provides a firm mechanical connection that fastens the MCM package to the printed wiring board as well as completing the electrical connections to printed circuitry on that wiring board. The foregoing connection apparatus and technique is well known.

If failed components were detected during subsequent electrical testing of the assembled board, the failed components needed to be removed from the printed wiring board for repair or replacement. The problem in reworking MCM's, whether fastened to the circuit board by regular adhesives or with a solder ball grid array, is recognized as endemic to other large size electronic semiconductor components as well, even those that contain only a single physically large semiconductor chip. As those skilled in the art recognize, the more modern semiconductor chips are growing in physical size as more and more circuit functions are expected to be packed within a single die even in commercial devices, such as cellular telephones. As a consequence large numbers of very fine closely spaced wires are required to interface to the semiconductor die. Because the wires must all extend into the die they are necessarily physically small in width and must be packed closely together, typically one mil in diameter separated by a two mil space. However, conventional printed circuit board technology typically provides semiconductor die interface connections with no less than a four mil separation.

To resolve the apparent physical incompatibility in spacing requirements, the approach taken has been to mount the semiconductor chip onto an intermediate "interposer" substrate, which is often formed of ceramic material. The printed wiring formed on the substrate fans out from the microscopic spacing at the location of the semiconductor die or chip to the wider spacing and wider wiring required by the conventional printed circuit board.

That electronic semiconductor assembly is then mounted onto the printed circuit board. The electrical leads from the assembly substrate are soldered to the mating solder pads on the printed circuit board, or, should the substrate instead employ a solder ball grid array, the solder balls are soldered to the mating solder pads formed on the printed circuit board. As in the case of the earlier described MCMs, in the foregoing arrangement, viewed in a generic sense, one multi-layer printed circuit board is mounted atop another printed circuit board. The dimension critical wire bonding of the electrical leads to the chips, thus, is accomplished on the ceramic substrate. Interconnect to the printed circuit board is accomplished by soldering the electrical leads from the substrate to mating pads on the conventional circuit board. With such an interposer or intermediate substrate, in retrospect, one recognizes the parallel between the foregoing structure and that of the MCM, earlier described.

Heat was employed to assemble each of the foregoing electronic components; and heat is the means that was typically used to remove an MCM or other thermally bonded unit from the printed wiring board. The difficulty and problems encountered in removing MCM's from the printed wiring board for rework, particularly in large size MCM's, those over 1.5 inch in a dimension, using traditional techniques, such as application of a heat gun, is described at some length in the Berkley '792 patent to which the interested reader may make reference and need not be here repeated.

The Berkely et al '729 patent describes a new structure by means of which heat may be uniformly applied to the underside of the substrate sufficient to permit detachment of the MCM from the printed wiring board without damage. The reworkable MCM presented in the Berkely et al '729 patent includes electric heater elements formed in a metallized pattern typically printed on the bottom most internal layer of the multi-layer substrate of the MCM; in effect to form an integral heater assembly. In addition to the multiple layers of the substrate that contains the printed-on metal interconnections for the semiconductors and input-output connections of the MCM, a dedicated bottom layer to the multi-layer substrate contains a number of printed and fired-on resistive conductors, suitably arranged in a pattern, such as a serpentine pattern, each of which serves as a heater. When current is passed through the heater, the resulting $I^2R$ losses in the conductor of the heater is evoked as heat. Together, the multiple heaters effectively covers the surface of the bottom layer with heat; and the heat is conducted to the adhesive bond to the printed wiring board. By design, the heat produced is sufficient to weaken the bond between the substrate of the MCM and the printed wiring board, but is insufficient to cause delamination of the multiple layers of the substrate.

The Berkely et al '729 patent also discloses a preferred embodiment in which the electrical conductors and supporting layer that forms the heater (or heaters) are formed of the same conductor and substrate materials used in the other layers of the multi-layer substrate, such as aluminum oxide and tungsten, respectively, permitting convenient manufacture of the heater as part of a conventional substrate fabrication process.

By incorporating within the structure of the electronic semiconductor components a heater that facilitates removal of that component from its installed adhesive-bonded position on a printed wiring board in the event of a semiconductor component failure, individual electronic semiconductor components may be expeditiously and efficiently removed and replaced. Any necessity for discarding the entire printed wiring board, along with other good electronic components, is avoided, eliminating the expensive procedure of building the entire circuit board assembly anew.

The individual heaters in the MCM described in the Berkely et al '729 patent are connected electrically in parallel between elongate conductors along a pair of opposed sides of the substrate, as example, along the front and rear sides of the substrate; and each heater is formed of a fine line of metal. In one embodiment, each heater forms a serpentine-like pattern in between the two sides. A large number of such heaters cover the area of the substrate, thirteen in one example of the '792 patent. As one realizes, if the heater wire of an individual heater in the foregoing structure is broken, that heater cannot conduct electrical current. Since the heat produced by the heater wire is produced by the $I^2R$ loss, being unable to conduct current, no heat can be produced; and that produces a heating discontinuity in the substrate that could wholly or partially negate the advantage of the embodiment of the Berkely et al '729 patent.

A current-interrupting break could be produced during fabrication processing of the substrate layers, as example, should a piece of dust lodge on the substrate during plating. A second possibility for creating a break is due to mishandling during assembly of the MCM. As example, should an assembler inadvertently scratch the substrate on another solid and scrape or cut through a heater line. A third possibility occurs during rework of the MCM, should the technician raise the voltage applied to the heaters to a level that results in too high a current through a heater lead, one or more of the heaters may overheat and, like a fuse, burn out, producing a break in the line. Unless the break is large enough to visually observe, it can only be found by testing. For consistency it would be necessary to electrically test each substrate produced, and that testing procedure takes time and effectively raises the production costs. Irrespective of the underlying reason for a current-interrupting break in a heater, the availability of some means to automatically "patch up" the break or effectively minimize the effect of a break in a heater as would give the MCM a fault tolerant characteristic, and would be of benefit to and improve upon the foregoing combination.

Accordingly, a principal object of the present invention is to provide a reworkable MCM or other electronic semiconductor component that employs an integral heating system for permitting detachment of the component from a printed wiring board with a heater system that is fault tolerant.

And another object of the invention is to eliminate the necessity for testing of the integrity of heaters contained in a reworkable electronic component so as to reduce production cost without detracting from the effectiveness of the heaters, even though one or more of the heaters contains a break.

SUMMARY OF THE INVENTION

In accordance with the foregoing objects, the invention incorporates fault tolerance within the integral electric heaters of a reworkable electronic semiconductor component, such as a reworkable multi-chip module, to increase production yield and longevity of the rework feature. Components of the foregoing kind contain a multi-layer substrate to bond to a printed wiring board, and, for rework, the component includes a plurality of electric heaters arranged side by side on a bottom layer of the substrate. When energized with current, the heaters generate sufficient heat to weaken the adhesive or solder bond to the printed wiring board without delaminating the layers of the substrate, allowing the electronic semiconductor component to be pulled away from the printed wiring board for rework. Additional circuitry, specifically a series of buses, is included to automatically route heater current around, that is, bypass any current-interrupting break (or breaks) as may form in any of the electric heaters rendering the heaters tolerant to that kind of fault.

The foregoing and additional objects and advantages of the invention together with the structure characteristic thereof, which was only briefly summarized in the foregoing passages, will become more apparent to those skilled in the art upon reading the detailed description of a preferred embodiment of the invention, which follows in this specification, taken together with the illustrations thereof presented in the accompanying drawings.

DESCRIPTION OF THE PREFERRED EMBODIMENTS

Figure 1:
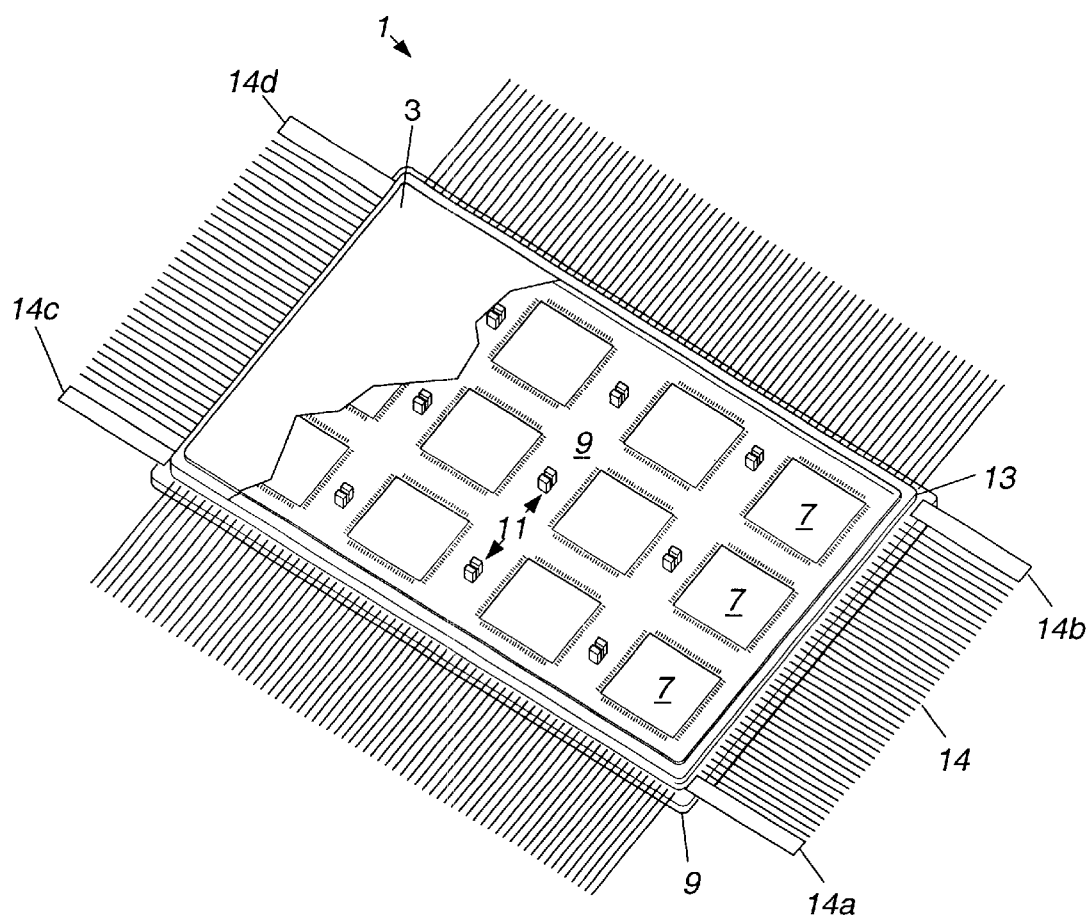
FIG. 1 is a perspective view of an MCM that incorporates the invention.

The invention is described in connection with a Multi-Chip Module. Reference is made to FIG. 1, which illustrates one example of a Multi-chip Module ("MCM") 1 in a top perspective view, with the module lid 3 partially cut away. A plurality of semiconductor dice or chips 7, only three of which are labeled, are mounted at various locations upon a dielectric multi-layer substrate 9, and a plurality of small electrical components 11, only two of which are labeled, are also mounted to the substrate 9. The semiconductor chips are not encased. The various junctions and metal traces exposed on the top surface of the semiconductor chips are very small in relative size and are not readily visible, nor illustrated in the figure.

A wall or ring 13 of metal or ceramic material borders the periphery of substrate 9, and is bonded in place on the substrate, suitably by brazing. The wall serves to raise and support the lid 3 above the height of the confined semiconductor chips 7. A large number of metal traces printed on and in the substrate 9, not illustrated, define various power and signal paths, that interconnect the various semiconductor chips 7 within the module and/or provide electrical connections therefrom to external leads 14 to the module, extending in rows from the module's four sides.

Even though no particular electronic circuit has been illustrated in the foregoing figures, it should be understood that the present invention is not directed to any particular electronic circuit, or semiconductor package. Hence any illustration or description of the details of any such electronic circuit or package would only serve to introduce unnecessary complexity to the present description and would not aid one to understand the invention. Accordingly, other than to note the presence of such elements in a practical module, such elements are neither illustrated or described in detail.

The view of the foregoing MCM in FIG. 1 is the same in appearance as the prior reworkable MCM, containing the same electronic circuit function and features described in the Berkely et al '729 patent, since the physical differences required by incorporation of the invention are not visible from this view. The MCM includes a fault tolerant embedded heater system that is not visible in this figure. One approach for applying power to the embedded heater is illustrated. Leads 14a and 14b on ends of the row of leads on the right side of the figure, and leads 14c and 14d on the ends of the rows on the left side, are provided exclusively for supplying current to the heater circuit.

The foregoing leads are wider than the other leads in the respective rows, hence are capable of carrying greater levels of current than the more narrow leads, and are required to conduct the relatively large current required by the internal heater (or heaters), not illustrated in the figure. Alternatively, one might instead use a number of the more narrow leads, electrically connected in parallel, to carry the heater current; or one may omit the leads dedicated to the heater entirely, and make connection to the heater circuit by soldering wires directly to the top surface pads only when it becomes necessary to utilize the heater circuit for rework.

Figure 2:
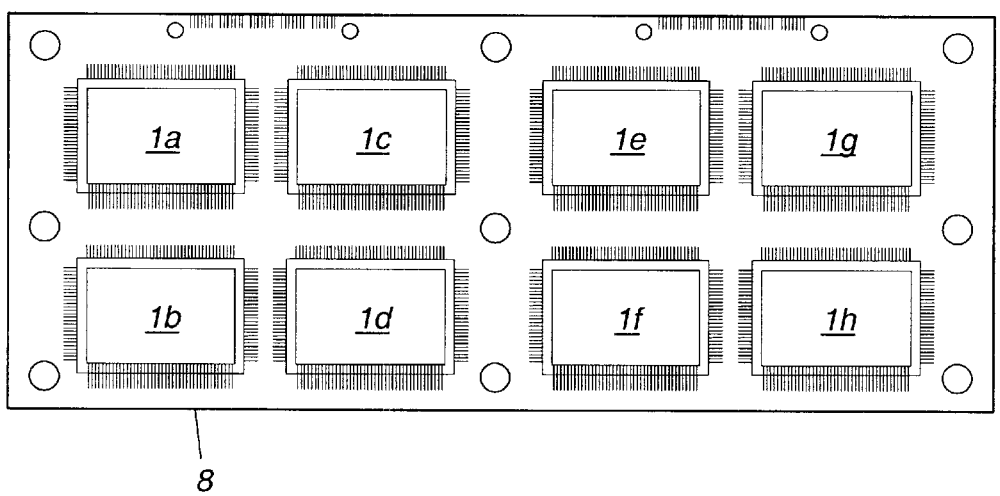
FIG. 2 is a top view of a circuit board containing a number of the MCMs of FIG. 1.

For operation, the MCM is fastened to a larger printed wiring board on which the MCM along with other MCMs and components forms a larger electronic system. Such an assembly is pictorially represented in FIG. 2, wherein eight such MCMs 1a through 1h are secured to one side of a printed wiring board 8, As represented in a side view in FIG. 3, printed wiring board 8 may contain like numbers of MCMs on its opposite surface as well, such as illustrated by MCMs 2a and 2b.

As is the conventional practice for MCMs, the MCMs bottom surface is bonded to the printed wiring board 8.

Figure 3:
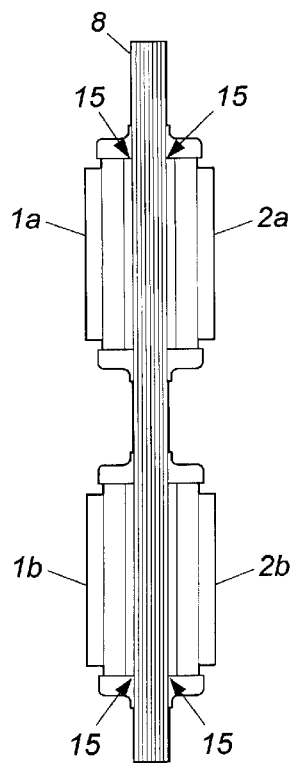
FIG. 3 is a side view of the circuit board assembly of FIG. 2.
Figure 9:
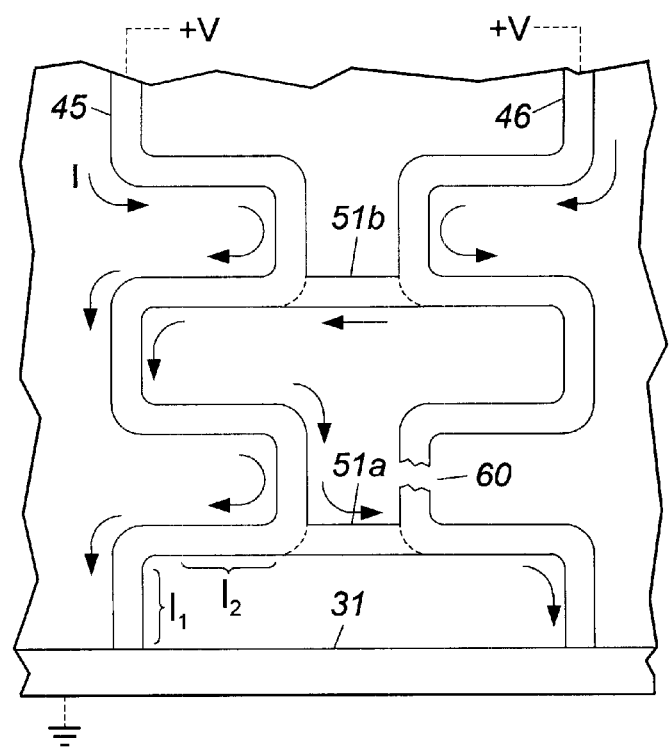

Bonding may be accomplished with a thermoset or thermoplastic adhesive, as represented to exaggerated scale at 15 in FIG. 3, or with solder in the case of a Ball-Grid Array (BGA), later herein described in connection with FIG. 9. A metal filled adhesive may be preferred for thermal or electrical reasons.

Figure 4:
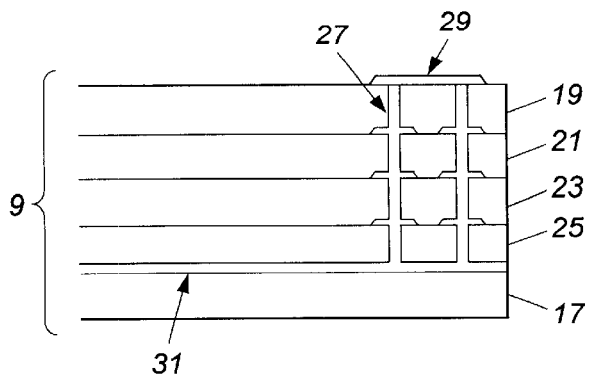
FIG. 4 is a partial side section of the MCM substrate drawn in larger scale.

An enlarged not-to-scale partial section of substrate 9 in MCM 1 is presented in FIG. 4 to which reference is made. The substrate is a laminate containing multiple layers formed of a dielectric material, such as aluminum oxide, aluminum nitride or beryllium oxide materials, including a bottom most layer 17, an upper most layer 19, and one or more intermediate layers 21, 23 and 25. As later herein described, a plurality of electrical vias 27 extend through the multiple layers of the substrate to form a part of the electrical path between contacts 29 on the upper surface and conductors on lower layers 17 and 25. Additional metal vias may be included there between as desired the sole function of which is to conduct heat away from the semiconductor die. Conductor 31, located on the bottom layer of the substrate, serves as one of the terminals to the embedded heater, later herein described in connection with FIG. 7.

Figure 5:
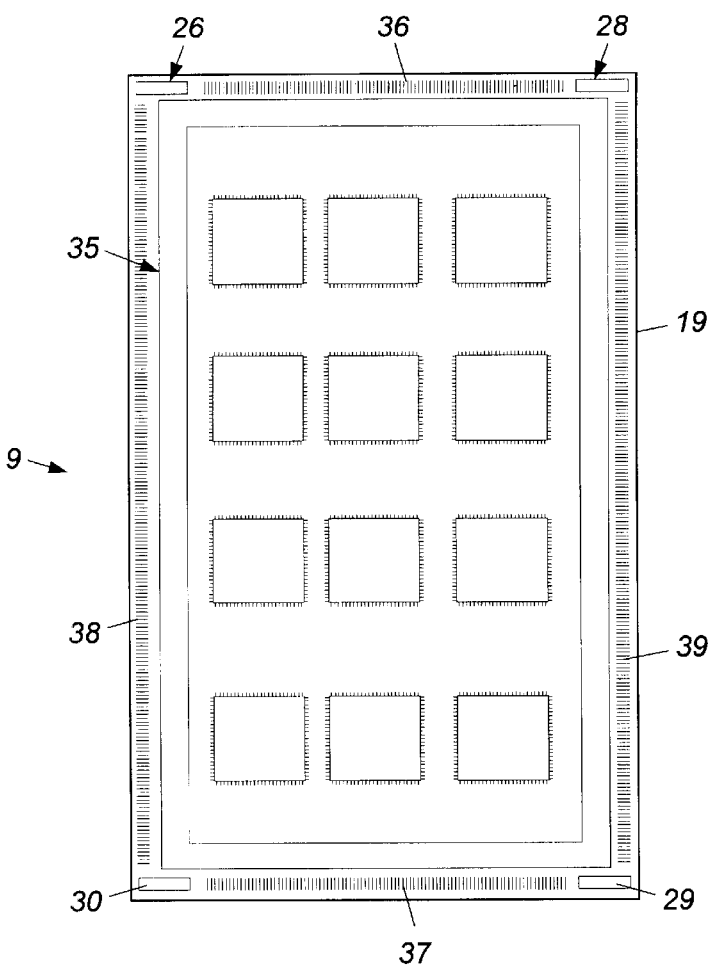
FIG. 5 is a top view of the top most layer of the MCM substrate used in the MCM of FIG. 1, showing a typical layout of signal and power conductors.

FIG. 5 is a layout view of the surface of upper most layer 19 of substrate 9 drawn in larger scale, illustrating the conductor layout on that substrate layer. The wide rectangular frame or loop 35 is recognized as the metallized pad onto which the seal-ring 13, illustrated in FIG. 1, is brazed in typical practice. A large number of very small sized metallized pads 36, 37, 38, and 39 evenly spaced in rows on the top, bottom, left and right sides in the figure, are recognized as the pads onto which the leads 14, illustrated in FIG. 1, are bonded or brazed. Four larger metallized pads or conductors 26, 28, 29 and 30 are located at each of the four corners, extending along the upper and lower edges of the layer. The latter conductors serve as the contacts or terminals for the electric heater illustrated in FIG. 7, later herein described.

Figure 6:
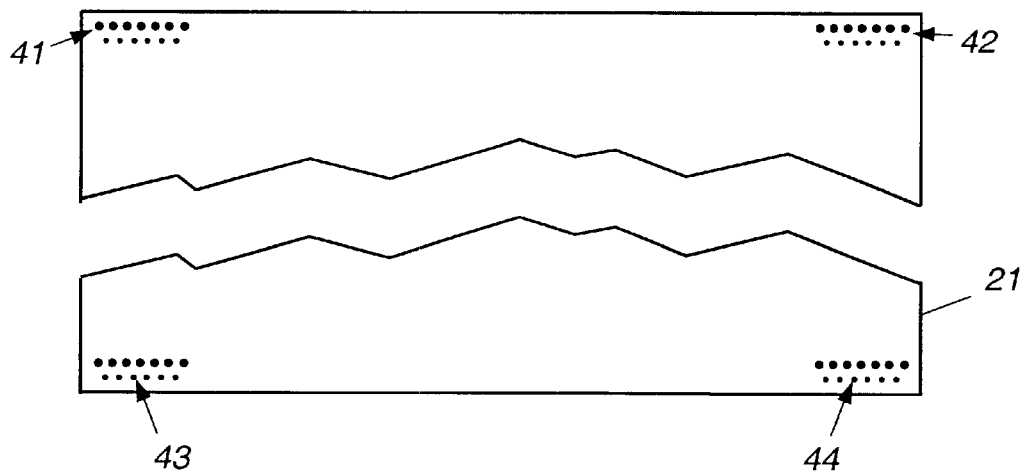
FIG. 6 is a top view of an intermediate layer of the MCM substrate containing electrical vias which interconnect the surface conductor layer of FIG. 5 to the conductors defining the heaters heater pattern of FIG. 7.

FIG. 6 partially illustrates a layout of an intermediate layer 21 of substrate 9, intermediate to the upper most and bottom most layers. The sets of small dots 41–44 at the four corners represent electrical vias that extend through the layer. These electrical vias connect each of the conductors 26, 28, 29 and 30 to the heater metallization pattern upon bottom layer 17 of the substrate illustrated in FIG. 7. The plurality of vias clustered at each corner of the layer in FIG. 6 are necessary to carry the required current level for the heater system, which is orders of magnitude greater than that carried by a typical power or signal via in normal circuit operation. A like set of conductive dots is present in the additional intermediate substrate layers 23 and 25 (FIG. 4). Many more like vias, not illustrated, would also be present across the layer, which serve to interconnect other pads on the surface with conductor lines printed on the intermediate layer, also not illustrated. These latter vias and printed-on lines comprise the various power and signal paths for the normal MCM circuit operation. Being unique to the particular circuit application of the MCM and not necessary to an understanding of the invention, those additional paths are not illustrated or described in detail.

Should the substrate 9 contain more than the three layers illustrated in the laminate, each additional intermediate layer would contain a like structure of vias 41–44, to extend the electrical connection between the surface pads and the heater circuit on the bottom layer 17 through those additional layers.

Figure 7:
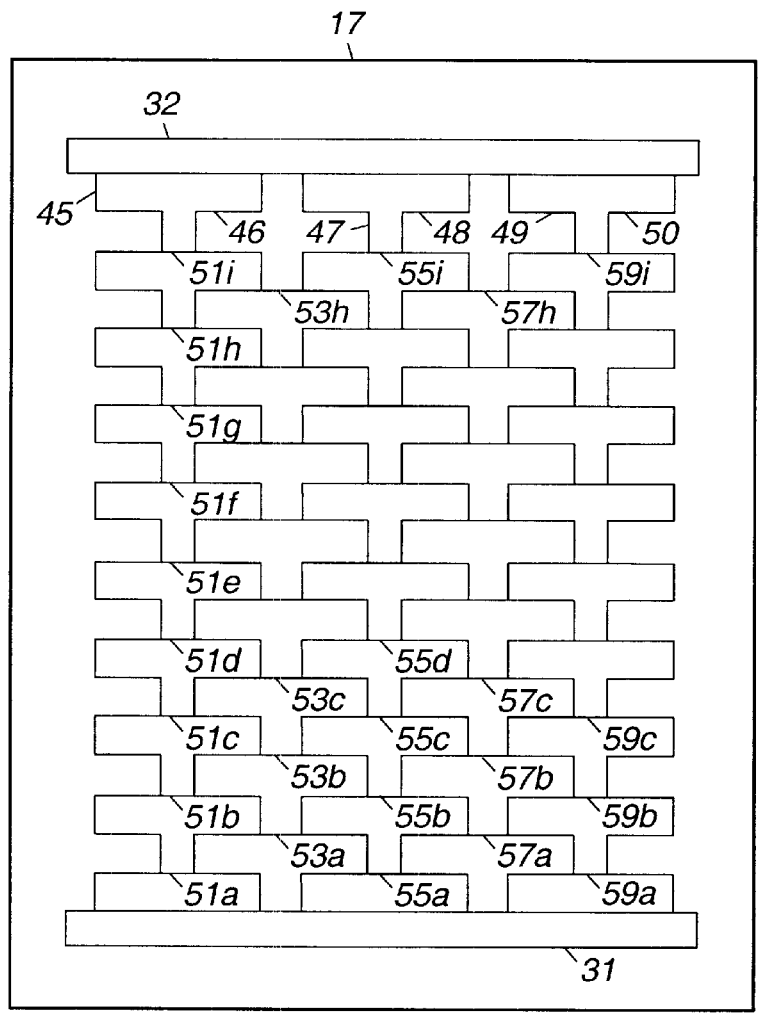
FIG. 7 is a top view of the bottom most internal layer of the MCM substrate used in the MCM of FIG. 1, showing the conductive heater pattern.

Reference is made to FIG. 7, which is a layout of the bottom most internal conductor pattern, printed on bottom layer 17 of substrate 9 that defines the fault tolerant heater system integrated within the MCM. A wide straight printed-on conductor 32 extends along the upper edge of the layer and a second wide straight printed-on metal conductor 31 extends along the lower edge of the layer, the pair of which serve as the electric terminals to the heater. In operation, the conductors 31 and 32 are connected to an external source of electric current, not illustrated, via terminals 14a–14d to the MCM, earlier illustrated in FIG. 1, and the vias, earlier described.

Apart from the two foregoing conductors the wiring pattern is seen to be unusual in geometry and difficult to describe in words. One approach to this description is to speak to the complicated pattern in terms of two sets of conductors. The first set is those conductors, which extend in a serpentine pattern from the top to the bottom in the figure, here referred to as heater conductors, such as numbered 45 through 50. The second set is the short lengths that extend laterally in the figure, called buses, such as buses numbered 51a–51I, 53a–53h and so on. The latter buses connect locations on one serpentine shaped heater conductor to a corresponding location on an adjacent serpentine shaped heater conductor. It should be understood that all of the conductors on this layer are formed at the same time during fabrication of the layers of the substrate. Even so the conductors are treated and discussed separately so that the functions of each section of foregoing conductor and operation of the invention is better understood.

In this layout, an even numbered plurality of printed-on conductors, specifically six, 45 through 50, the heaters, each of which extends between the upper and lower edges of the layer. Each of those conductors is configured, in this example, in a serpentine pattern of seventeen laterally extending loops over the distance between conductors 31 and 32. In conducting current, each of those serpentine shaped conductors serves as an electric heater. The first of those conductors 45, as counted from the left side of the figure, (and the third, fifth and all other odd numbered conductors) extends up from conductor 31 on the bottom left side of the figure, loops first in one direction, to the right in the figure, and then reverses direction, the second direction, to the left in the figure. The pattern of the conductor continues and repeats with additional such extensions and loops until the end of the conductor joins the laterally extending conductor 32.

The second of those heater conductors 46 (and the fourth, sixth and all other even numbered conductors) extends from the bottom of the figure up a short distance and first loops in the second direction, to the left in the figure, and then reverses direction, the first direction, to the right in the figure. The conductor continues extending in those loops from the bottom of the layer in the figure to the top at laterally extending conductor 32.

Each of the foregoing heater conductors 45–50 is identical in length, width and thickness. The geometry of each of the odd numbered conductors is identical and that of the even numbered conductors is identical. The geometry of the even numbered conductors is seen to be the mirror image of the odd numbered conductors. The upper end of each of the conductors connects to conductor 32 by which those ends are placed electrically in common. The opposite lower ends of those conductors are attached to conductor 31 placing the opposite ends of the conductors electrically in common. It should be recognized that the individual printed-on serpentine conductors of the plurality, each of which serves as an individual heater, collectively define one larger size electric heater.

One side of alternate loops of one conductor is connected by a conductor, here referred to as a bus bar, to the corresponding side of the confronting loop in the next adjacent heater conductor. Thus bus bar 51*a* connects the first side of the first loop in conductor 45, viewed from the side nearest conductor 31 at the lower edge, to the first side of the confronting (first) loop in adjacent conductor 46. Bus bar 51*b* connects the same locations on the third loop in conductors 45 and 46, 51*c* the fifth loop therein and so on.

Reference is next made to the bus bar interconnections between the second conductor 46 and the next adjacent conductor to the right, the third conductor 47. In this bus bar 53*a* connects the first side of the second loop in conductor 46 and the corresponding side of the confronting (eg. second) loop in conductor 47. Bus bar 53*b* connects the first side of the fourth loop in conductor 46 and the corresponding side of the confronting (eg. fourth) loop in conductor 47; bus bar 53*c* connects the first sides of the sixth loop of those conductors; and so on.

The foregoing pattern repeats with the bus bars connecting loops of the third and fourth conductors 47 and 48. Bus bar 55*a* connects the first side of the first loop in conductor 47 to the first side of the confronting (first) loop in adjacent conductor 47. Bus bar 55*b* connects the same locations on the third loop in conductors 47 and 48, 55*c* the fifth loop therein and so on. The bus bar connections between the loops of the fourth and fifth conductors, 48 and 49, follow that prescribed previously for the bus bar connections between the second and third conductors 46 and 47. Thus the first side of the second loop in conductor 48 is connected by bus bar 57*a* to the first side of the confronting second loop in conductor 49; bus bar 57*b* to the first side of the fourth loop in conductor 48 and the first side of the fourth loop in conductor 49; bus bar 57*c* to the sixth loop in those conductors and so on. The pattern of bus bar connections between the fifth and sixth conductors 49 and 50 repeats those of the first and second conductors and those for the third and fourth conductors. The buses are all the same in thickness, width and length; and are of the same width, thickness and material as the heater conductors 45–50.

In assembling the semiconductor die to the substrate during manufacture of the MCM 1, the die or chip is attached to the substrate using a thermally stable microelectronics adhesive. In the inert-gas environment typical of a hermetic package, such adhesives remain stable to temperatures in excess of 200° C. On the other hand, many commercially available thermoplastic and thermosetting adhesives used for attaching components to circuit boards have glass-transition temperatures (i.e., softening temperatures) well below 200° C. The latter temperatures are readily attainable through use of the described MCM heater. Once above its glass-transition temperature (Tg), the adhesive securing the MCM or like component to the circuit board will yield under mechanical load and the removal of the MCM from the circuit board proceeds readily. No load is applied to the adhesive used to secure the die or dice to the substrate, and while this adhesive may soften at the removal temperature, it will harden upon removing the heat source from the MCM.

Typical component removal temperatures, less than 200° C., also have no damaging effect on the substrate construction itself, as typical Multi-Chip and single-chip module substrates are fabricated from ceramic materials which have been laminated and sintered together at temperatures in excess of 1000° C., forming a monolithic structure impervious to moderately elevated rework temperatures.

For rework of the foregoing MCM, one polarity of the source of current, not illustrated, is connected to the leads 14*a* and 14*b* in the MCM illustrated in FIG. 1; and the opposite polarity source is connected to leads 14*c* and 14*d*. Current flows via contacts 14*a* and 14*b* into the MCM, into contacts 29 and 30, illustrated in FIG. 5, and from those contacts, flows down through the vertically extending electrical vias, including vias 41 and 42, through the multiple intermediate layers of substrate 9, to one end of the heater metalization pattern on the bottom most substrate layer, and across the pattern. From there the current flows through the vertically extending vias, including vias 41 and 42 on the opposite side of the intermediate layers, up to contacts 26 and 28, FIG. 5, on the upper surface of the substrate. From the latter contacts the current flows in parallel out leads 14*c* and 14*d*, and back to the opposite polarity terminal of the current source. As an alternative construction, the heater-dedicated leads 14*a*–14*d* may be omitted, in which case an electrical circuit would be completed by soldering, clipping, or conductive-adhesive attaching discrete wires from the current source to the substrate heater contacts 26, 28, 29 and 30.

The refractory metal conductors ("traces"), being resistive in character, produce an $I^2R$ loss, generating heat. That heat passes through the bottom layer and into the adhesive material bonding the substrate 9 to the circuit board 8. The circuit board ultimately conducts the heat away from the adhesive to the environment.

With a source of voltage connected across conductors 29 and 30, elsewhere herein described, and temporarily neglecting the bus bars, current flows through each of the heater conductors 45–50, generating heat, through the power losses generated in the resistivity of those conductors, the $I^2R$ loss, essentially as described in the prior Berkely et al '729 patent. Since the heater conductors are identical in length, width, composition, material and resistivity, and since the voltage applied across those conductors is identical, then the current, I, through each of those conductors should be identical. Likewise the $I^2R$ loss in each conductor is identical, and the heat thereby developed is identical. As those skilled in the art will appreciate, with the heater circuit functioning as described, which occur during a rework procedure, the buses 51, 53, 55, 57 and 59, even though conductively connected to adjacent heater conductors, have no effect on the foregoing operation and cannot carry current. Were the buses removed, that removal would not affect the operation of the heater.

Figure 8:
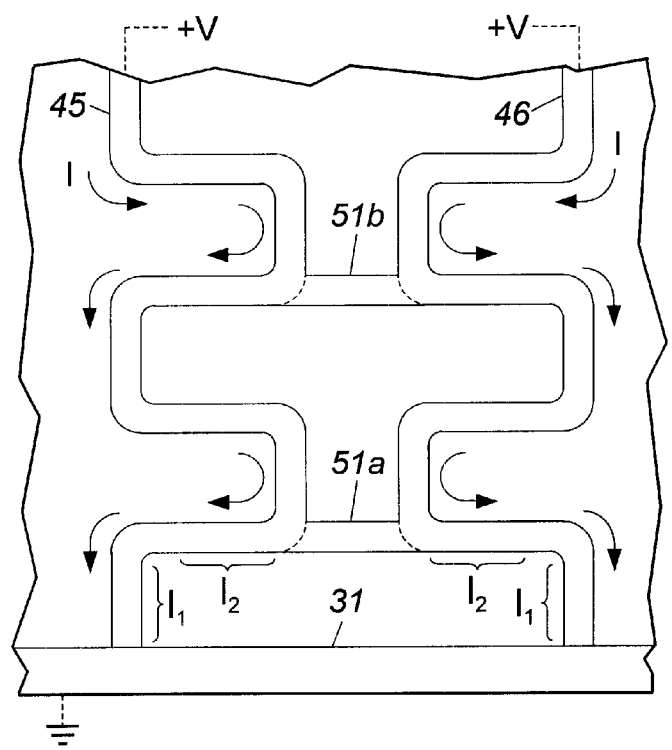
FIG. 8 is a pictorial view of a portion of the heater and FIG. 9 is the same pictorial view with a broken heater, both of which are used in connection with the explanation of the operation of the invention.

The foregoing is better understood by making reference to FIG. 8, which illustrates a small portion of the bottom layer of the substrate, heater conductors 45 and 46 of two adjacent heaters and bus bars 51*a* and 51*b* connected between a side of the confronting loops formed in the heater conductors. With equal voltage, +V, and identical heater conductors the current I drawn by each of heater conductors 45 and 46 is identical. The voltage at the left side of bus bar 51*a* is the voltage drop produced in sections L1 and L2 of heater conductor 45 and is equal to I×ρ (resistivity)×(L1+L2). The voltage at the right end of bus bar 51*a* is also equal to I×ρ (resistivity)×(L1+L2). Thus in accordance with ordinary DC network analysis, the voltage across the bus bar 51*a* is the difference of the foregoing two voltages, namely zero. With no voltage appearing across the bus bar 51*a*, no current is able to flow. The same situation is true for bus 51*b*. In each case the voltage at each end of bus 51*b* is the voltage drop created by the current, I, multiplied by the length of the portion of conductor 45 (and 46 respectively) from the point of connection to conductor 31 and the resistivity of the conductor. That voltage drop is only a fraction of the source voltage +V. Accordingly, with the heaters properly functioning the included bus bars have no effect on the functioning of the circuit and perform no function.

The operation changes should a break occur in a heater conductor. Reference is made to FIG. 9 which illustrates a break 60 in a loop in heater conductor 46. That formed discontinuity prevents current from flowing through the loop, a current disrupting break. Absent buses 51a and 51b the voltage at the juncture (and all along the upper portion of conductor 46 would rise to the source voltage, +V, while the bottom portion of the broken heater conductor would be at ground potential. And with normal current flow in heater conductor 45, the voltage at the location along conductor 45 at which bus 51b is positioned is the sum of the IR drops in the portion of conductor 45 between bus 51b and conductor 31.

With buses 51a and 51b connected in place, and break 60 present, the voltage at the right side of bus 51b would start to rise. In so doing the voltage at the right side of bus 51b is greater than that at the left side, creating a voltage difference. Accordingly, current flows from conductor 46 through bus 51b and into the adjacent heater conductor 45, contributing to an increased current in a small section of that conductor.

Because of break 60, one end of bus 51a is at ground potential (or as otherwise stated, at a lower potential than the normal voltage drop across sections L1 and L2 of heater conductor 45. With the increased current through conductor 45, that voltage drop would tend to increase from the static state. The foregoing produces a higher voltage on the left side of bus 51a than on the right, resulting in a potential difference. Accordingly current will flow from the left to the right through bus 51a, back into the lower section of the broken heater conductor 46, and thence to ground. Current also continues to flow through the remainder of heater conductor 45 and thence to ground also, a parallel path. The relative portions of the current is inversely related to the relative resistance of the two paths (L1+L2) and [L1+L2+ bus 51a length].

Effectively, a current path is formed around break 60 by buses 51a and 51b. A like action occurs between any other pair of buses when a break is present in a section of one of the heater conductors of two adjacent heaters located between the two buses. The foregoing description of operation does not attempt to define the current in each branch except in a general way that is sufficient to enable one to understand the operation.

Further, with increased current flow through the short section of heater conductor 45, greater heat is generated in the associated loop; and with current flow through buses 51a and 51b, which, in normal operation absent break 60, could carry no current, the buses now also generate some $I^2R$ loses and create heat. Although the heat generated in the section of the break is not quite the same as normal, the heat is almost uniform and serves the desired function in the vicinity of the break. Effectively thus the foregoing bus structure automatically corrects a break and renders the semiconductor component heater system fault tolerant.

Each parallel heater, including the bus bars, is constructed of a resistive material, preferably having a range of resistivity of (and including) 0.01 ohms-per-square to 1.0 ohms-per-square. An example of metals of the former resistivity is gold or copper of a thickness of 20,000 Angstroms. An example of a metal of the latter resistivity is that which is used in the preferred embodiment, Tungsten of about 1,200 Angstroms thickness. The aspect ratio conductor trace length to width ratio of each element is from 50 to 500 so that each heating element is able to generate one to five watts of power with a five volt supply. The total power and target temperature may be adjusted by increasing or decreasing the supply potential.

A five ohm resistive parallel interconnected heater traces that are one inch in length and 10 mils wide spaced 50 mils apart should with a five volt supply should provide 20 watts of heating power in a one square inch area.

In one conventional type of MCM substrate construction, known as High Temperature Co-fired Ceramic (HTCC), refractory metals such as tungsten are used as the main constituent of the ink which is printed-on to form the printed conductors, the conductive traces for the interconnections on each of the substrate layers and the buses. Tungsten is compatible with the high firing temperatures inherent in substrate fabrication. These refractory metal conductors naturally lend themselves to the formation of heating element structures and do not require any special materials or process changes in the standard HTCC substrate fabrication technique. Moreover, the resistivity of the conductor metalization is such that practical resistances for heater elements can be tailored through simple geometrical manipulation of the artwork pattern used to form the heater element.

This same approach for incorporating the heater element is applicable to any HTCC component substrate, for instance, certain types of single-chip Quad-Flat Pack or Ball Grid Array packages. Embedding equivalent heaters in non-HTCC type components is possible, as later herein discussed, but, for practical reasons those structures may require the incorporation of additional materials or processes outside the normal fabrication procedure.

The foregoing embodiment of the invention was described in connection with MCMs and thermoset (eg. epoxy) or thermoplastic adhesive for bonding to the printed wiring board. However, it should be appreciated that nothing in the design precludes the use of the invention with other types of adhesives and/or other electronic components, all of which is understood to be within the scope of the present invention. The foregoing emphasis on MCMs and epoxy merely illustrates a preferred embodiment of the invention and its application.

As earlier noted, the integral heater system of the Berkely '729 patent and, hence, the fault tolerant heater system of the present invention may be used with other thermally sensitive fastening materials, such as solder. MCMs and other electronics components may be connected to a printed wiring board using an array of solder balls. Such Ball Grid Arrays ("BGAs"), well known in the electronics art, employ small solder spheres or, sometimes columns, as the mechanical and electrical connection between the circuit board and the component, in lieu of extending electrical leads 14 employed in the embodiment of FIG. 1.

Figure 10:
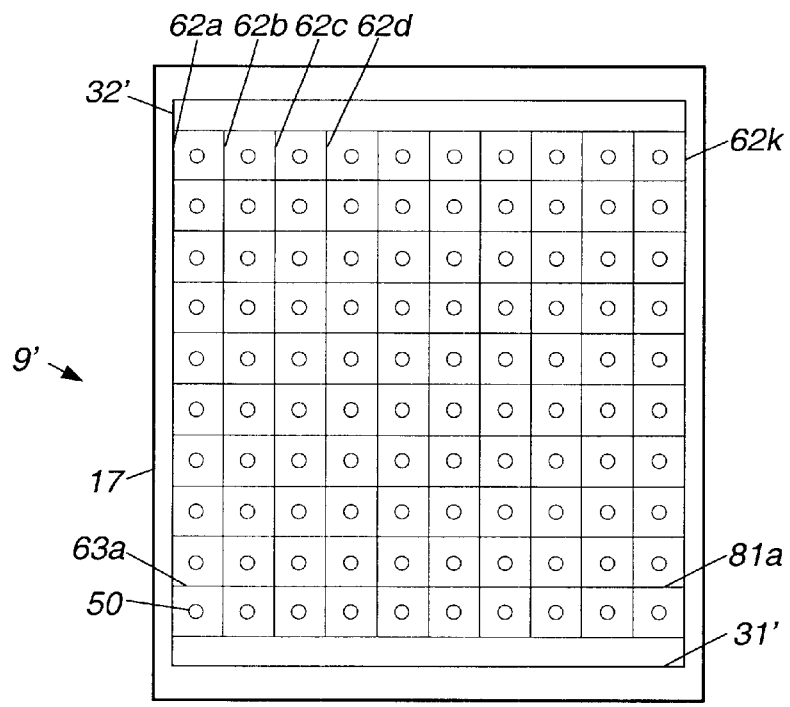
FIG. 10 is a bottom view of an alternative embodiment of the invention used in a semiconductor component that employs a ball grid array.

As example, the illustration of FIG. 10, not drawn to scale, provides a bottom view of such an alternative embodiment of the MCM of FIG. 1, constructed using a BGA for the electrical and mechanical connections. For convenience the elements in this figure are denominated by the same number primed as was used to identify the corresponding element in the prior embodiment. In such an alternative structure, the bottom side of the bottom layer 17' of substrate 9' contains the solder balls 50, which are typically arranged in rows and columns. Those solder balls are attached to the ends of various electrical vias of conventional structure, not illustrated, that extend through the bottom substrate layer and one or more of the substrates multiple layers to extend electrical paths to the appropriate electrical circuit and/or semiconductor chips affixed to the substrates upper surface.

In this embodiment the individual heaters 62A–62K are straight lines in geometry and extend between the laterally extending between upper conductor 32' and the laterally extending lower conductor 31'. Those lines are evenly spaced across the area of the substrate. The bar busses are also evenly spaced. The geometry of the interconnecting buses are aligned to also form straight lines. Those bus lines are oriented perpendicular to the lines of the heater wires with each bar bus intersecting and contacting each of the heaters. Both the bar busses and the heaters are formed of identical metal and are the same in width and thickness so as to possess identical resistivity characteristics. In appearance the array of conductors forms a large multi-cell grid and resembles a wire mesh screen.

Figure 11:
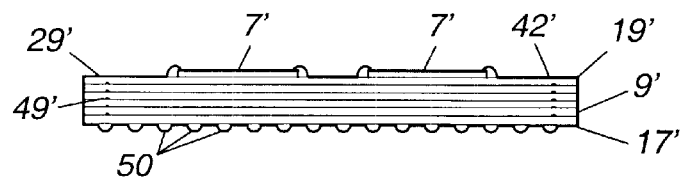
FIG. 11 is a side view of FIG. 10.
Figure 12:
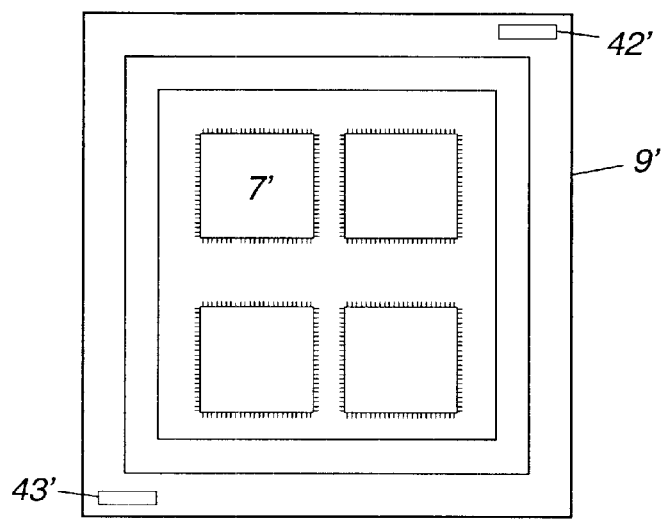
FIG. 12 is a top view of FIG. 10.

As illustrated in the side view of FIG. 11 and the top view of FIG. 12, to which reference is made, electrical vias 27' extend from pads 42' and 29' on the upper surface of top layer 19' of the substrate, through all intermediate layers of the substrate, to the respective termini 31' and 32' of the heater element on the upper surface of bottom layer 17'. Like the embodiment of FIG. 1, semiconductor chips 7' are attached to the upper surface of the top layer 19' of substrate 9' and the electrical interfaces from those chips are wire bonded to appropriate pads on the substrates upper surface. Electrical paths between the various pads, and from the pads to the solder balls on the bottom of the substrate, are completed with metallic traces printed on the substrates various internal layers, and with vias through the layers, as necessitated by the particular circuit function. The details of such conventional interconnect structure, not being necessary to an understanding of the invention, are not further described.

As illustrated in the side view of FIG. 11, the semiconductor chips or dies 7' are attached to the upper surface of the top layer 19' of substrate 9' and the electrical leads from those dies or chips are wire bonded to appropriate solder pads, not illustrated, on the substrates upper surface, the same as with the embodiment of FIG. 1. Through those solder pads various electrical paths are completed through and about the substrate and to the electrical vias that terminate at the various solder balls, as necessitated by the particular circuit functions for the semiconductor chips, the details of such conventional structure not being necessary to the understanding of the invention and are not be further described.

The embodiment of FIG. 7, to which reference is again made, contains six heater wires 45–50 that extend between the upper power supply bus 32 and the bottom power supply bus 31. However, the number of rows of buses 51a, etc. differs by one from the number in the adjacent row. From the left, the first row of buses that interconnect heater wires 45 and 46 contains nine parallel buses 51a–51i. The second row of buses that interconnect heater wires 46 and 47 contains eight parallel buses 53a–53h. The foregoing numbers of buses is repeated in the third, fourth and fifth rows as is evident from inspection of the figure. The layout is symmetrical about the center.

Broadly speaking, it may be stated that the quantity of buses included in the foregoing arrangement is divided into groups of buses. That parsing amongst the groups of buses is uneven to the extent that the groups of buses in the odd-numbered rows, counting from the left, contain one more bus than the quantity of buses in the groups of buses located in the even numbered rows. In contrast, the corresponding groups of buses in the embodiment of FIG. 9, to which brief reference is again made, contain the same number of buses.

Although the foregoing heater structure was explained in terms of heater conductors and interconnecting buses, inspection of FIGS. 7 and 10 shows that the conductor patterns may also be described in alternative language. Referring first to FIG. 7, which is the more complicated wiring pattern, it is seen that the individual heaters are formed of a serial arrangement or column of closed conductor loops and the sides of the column are in contact. Each closed conductor loop contains at least one side (or portion of at least one side) in common with the next closed conductor loop in the column. And each column of loops extends from conductors 32 and 31, the latter of which serve as a side to the upper and lower end loops, respectively.

As example, consider the closed conductor loop formed at the upper end of conductors 45 and 46 resembling the letter "T". The front end of conductor 32 serves as a side to the end loop. Another closed loop forming an identical "T" shape is positioned immediately below the foregoing loop. A portion of the upper side of the foregoing intermediate closed loops is shared in common with the foregoing loop at the upper end of the column. All of the intermediate closed loops in this first column are identical in size and are of the T-shape, and each shares a one side or a portion thereof with the preceding closed loop in the column and shares another side or a portion thereof with the succeeding closed loop in the column. The closed loop at the lower end of the column (containing bus 51a) is rectangular in shape, and one wall thereof is formed by the lower conductor 31.

In the next adjacent column of closed loops, the first closed loop forms a "+" or cross in shape. The remaining loops in the column are of the same size "T" shape as those closed loops in the first column. As in the first column each of the closed loops at the upper and lower ends contains a side formed by the respective adjacent transverse conductors 32 and 31, respectively. All of the intermediate closed loops in this second column are identical in size and are of the T-shape, and each shares a one side or a portion thereof with the preceding closed loop in the column and shares another side or a portion thereof with the succeeding closed loop in the column.

The line of closed conductor loops in the third and fifth columns (and any other odd numbered column) are identical in size and shape to those closed conductor loops of the first column, and the line of closed conductor loops in the fourth column (and any other even numbered column) is identical to the line of closed conductor loops in the second column.

In addition it is seen that the closed loops in the columns share a side with a closed loop in an adjacent column. The closed loops in the end columns, the first and the fifth in the foregoing embodiment, each share a side or sides with one or two closed loops in the adjacent column. The closed conductor loops in each of the other columns, intermediate the first and the fifth column, share a side or sides with one or two closed conductor loops of a column to one side, and share another side or sides with one or two closed conductor loops of a column to the other side of the column.

The heater structure of FIG. 10 is more regular in shape and less complex. In this embodiment the closed conductor loops are all square in shape and are arranged in seven columns. Each column of closed loops is straight sided.

As in the prior embodiment, each closed conductor loop has a side in common with another closed conductor loop in the column. The intermediate ones of the closed conductor loops in the column contain one side that is shared with a preceding closed conductor loop in the column and another opposed side that is shared with a succeeding closed conductor loop in the column. Each closed conductor loop in each column contains still another side that is shared with a closed conductor loop of an adjacent column. Each closed conductor loop in one of the intermediate columns shares another side with a closed conductor loop in the column to the left and shares an opposite side with a closed conductor loop on the right.

As one appreciates from an understanding of the invention, the conductor pattern may be of complex or simple in design and may be reproduced in various designs and be described in many different ways all of which come within the scope of the invention.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. In a reworkable semiconductor device designed for bonded attachment to a printed wiring board, said semiconductor device including at least one semiconductor chip, a multi-layer substrate and a plurality of electric heaters;

said multi-layer substrate including a bottom layer for bonded attachment to said printed wiring board and a top layer for bonded attachment to said semiconductor chip; said bottom layer having a top surface for attachment of said plurality of electric heaters and said bottom layer being heat transmissive in characteristic wherein heat produced by application of heater current through said electric heaters is conducted throughout said bottom layer to said bottom surface of said bottom layer for weakening any bonded attachment of said multi-layer substrate to said printed wiring board, whereby said semiconductor device may be removed from said printed wiring board for rework, the improvement therein wherein each of said plurality of electric heaters is of a predetermined structure and conducts heater current equally and further comprising:

fault tolerant means for rendering said plurality of heaters tolerant to current interrupting breaks, whereby said plurality of heaters may continue to produce heat when heater current is applied, notwithstanding the presence of a current interrupting break in a heater.

2. The reworkable semiconductor device defined in claim 1, wherein said fault tolerant means comprises:

conductor means responsive to the presence of current interrupting break in any one of said plurality of electric heaters for routing heater current for said one of said plurality of electric heaters through an adjacent one of said plurality of electric heaters and around said current interrupting break to maintain heater current through a remainder of said one of said plurality of electric heaters.

3. The reworkable semiconductor device defined in claim 2, wherein said conductor means further comprises:

a plurality of straight metal traces, said straight metal traces being spaced apart and oriented in parallel; said straight metal traces oriented at right angles to and intersecting said plurality of electric heaters and being in electrical contact with said electric heaters at each location at which said straight lines of said second plurality of straight metal traces intersect said electric heaters of said plurality of electric heaters.

4. The reworkable semiconductor device defined in claim 2, wherein said plurality of electric heaters comprises an even number.

5. The reworkable semiconductor device defined in claim 2, wherein said plurality of electric heaters are positioned side by side to form a plurality of columns of electric heaters, and wherein each of said electric heaters includes a first plurality of spaced locations at predefined positions along said heater, each of said first plurality of spaced locations in an electric heater acquiring a voltage level distinct from the voltage level acquired by the other of said first plurality of spaced locations in the respective electric heater when a heater current flows entirely through said electric heater, and in which said first plurality of spaced locations in any one of said electric heaters corresponds to a like plurality of spaced locations in another of said electric heaters that is positioned adjacent thereto:

and wherein said conductor means further comprises:

a plurality of groups of conductors, each group comprising multiple conductor buses, said plurality of groups numbering one less than said number of said plurality of electric heaters, and each said group in said plurality being associated with a pair of said plurality of electric heaters located in adjacent columns;

each conductor in a group being connected between a respective one of said plurality of spaced locations in a respective one of said electric heaters and the corresponding spaced location in the adjacent one of said electric heaters of a corresponding pair of electric heaters.

6. The reworkable semiconductor device defined in claim 5, wherein each electric heater in said plurality of electric heaters, exclusive of a first and a last one in said side-by-side relationship of said plurality of electric heaters, further includes a second plurality of spaced locations at predefined positions along said heater, each of said second plurality of spaced locations in an electric heater acquiring a voltage level distinct from the voltage level acquired by the other of said second plurality of spaced locations in the respective electric heater when a heater current flows entirely through said electric heater, and in which said second plurality of spaced locations in any one of said electric heaters corresponds to a like plurality of spaced locations in another of said electric heaters that is positioned adjacent thereto.

7. The reworkable semiconductor device defined in claim 6, wherein each of said plurality of electric heaters comprises a straight conductor and extend in a first direction across said bottom substrate layer; and wherein each conductor in said plurality of groups of conductors extends comprises a straight conductor and extends in a second direction transverse to said first direction.

8. The reworkable semiconductor device defined in claim 7, wherein each conductor in a group of conductors in said plurality of groups of conductors is in alignment with a conductor located in every other group of conductors to thereby define another straight conductor extending across said bottom layer of said multi-layer substrate.

9. In combination with an electronic component containing at least one semiconductor device mounted to a multi-layer substrate, said substrate including a bottom layer for bonding said electronic component to a printed wiring board, a fault tolerant heater supported on an upper surface of said bottom layer of said substrate, said fault tolerant heater comprising:

first and second elongate conductor traces formed on said upper surface positioned in spaced relationship extending across said bottom layer of said substrate and defining a surface region there between;

a plurality of columns of conductor traces formed on said upper surface of said multi-layer substrate, said columns being positioned side-by-side, one end of each column being in contact with a first of said elongate conductor traces and an opposite end of each column being in contact with a second one of said elongate conductor traces, said columns including a first column, a last column and intermediate columns between said first and last columns;

each column in said plurality of columns further comprising:

a set of closed conductor loops, said set of closed conductor loops including an initial closed conductor loop, a final closed conductor loop, and a number of intermediate loops;

said initial closed conductor loop including a side formed by said first elongate conductor trace, and an opposed side shared in common with an intermediate closed conductor loop next in position in said set;

said final closed conductor loop including a side formed by said second elongate conductor trace, and an opposed side shared in common with an intermediate closed conductor loop immediately preceding in position in said set;

and each intermediate closed conductor loops sharing one side with at least one of said intermediate closed conductor loops or said initial closed conductor loop and sharing an opposed side with at least another one of said intermediate closed conductor loops; and wherein each closed conductor loop of an intermediate column sharing a side or portion of a side with at least one closed conductor loop of another column positioned to one side and sharing another side or portion of a another side with at least one closed conductor loop of still another column positioned on an opposite side of said intermediate column.

10. The combination as defined in claim 9, wherein each said closed conductor loop comprises a right polygon in geometry.

11. The combination as defined in claim 10, wherein said right polygon comprises a square.

12. The combination as defined in claim 11, wherein said squares are of identical size, wherein said columns define straight sides.

13. The combination as defined in claim 9, wherein said closed conductor loops in odd numbered ones of said plurality of columns comprises a letter "T" shape in geometry, exclusive of an end one of said closed conductor loops which comprises a rectangle in geometry; and wherein said closed conductor loops in even numbered ones of said plurality of columns comprises a letter "T" shape in geometry, exclusive of an end one which comprises a cross-shape in geometry.

14. The combination as defined in claim 13, wherein all closed conductor loops of a "T" shape in said columns are of the same size.

15. The combination as defined in claim 9, wherein at least said odd numbered columns are identical in geometry.

16. In a electronic semiconductor component, said semiconductor component including a semiconductor chip, said semiconductor chip including a plurality of electrical interface leads, and a multi-layer substrate having a predetermined area for supporting said semiconductor chip on a printed circuit board, said multi-layer substrate having dimensions defining said predetermined area, said multi-layer substrate comprising a laminate of layers of a predetermined material, said multi-layer substrate including first electrical connections for electrical connection to said electrical interface leads of said semiconductor chip and second electrical connections for electrical connection to predefined locations upon said printed circuit board, said lower most layer of said multi-layer substrate comprising a plurality of electric heaters connected electrically in parallel for producing heat uniformly over said predetermined area, said heat being sufficient to weaken said second electrical connections to said printed circuit board and being insufficient to delaminate layers of said multi-layer substrate from one another or to weaken said first electrical connections, each of said electric heaters being of the same predetermined length and extending between first and second power supply bus bars extending along opposed edges of said lower most layer of said multi-layer substrate, the improvement therein wherein said lower most layer of said multi-layer substrate further comprises:

a plurality of electrical buses, said buses being capable of generating heat responsive to current flow there through;

said plurality of buses being connected between a respective one of said electric heaters and another one of said electric heaters located adjacent to said one of said electric heaters at distinctive spaced locations along said electric heaters and oriented parallel to said first and second power supply bus bars, wherein said buses are symmetrically distributed about said multi-layer substrate;

whereby during operation of said plurality of heaters a pair of adjacent ones of said electrical buses routes current from said one of said heaters through a portion of an adjacent heater on the occurrence of a break in said one electric heater and back into said one of said heaters, when said break in said one heater is located between said pair of electrical buses.

* * * * *